United States Patent
Matsuda et al.

(10) Patent No.: US 9,807,899 B2
(45) Date of Patent: Oct. 31, 2017

(54) STORAGE DEVICE

(71) Applicant: Toshiba Memory Corporation, Minato-ku (JP)

(72) Inventors: Yoshiharu Matsuda, Kawasaki (JP); Akitoshi Suzuki, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/049,232

(22) Filed: Feb. 22, 2016

(65) Prior Publication Data

US 2017/0188477 A1   Jun. 29, 2017

Related U.S. Application Data

(60) Provisional application No. 62/271,890, filed on Dec. 28, 2015.

(51) Int. Cl.
*H05K 7/14* (2006.01)
*H05K 7/20* (2006.01)

(52) U.S. Cl.
CPC ............. *H05K 7/142* (2013.01); *H05K 7/205* (2013.01); *H05K 2201/042* (2013.01)

(58) Field of Classification Search
CPC .......... H05K 7/142; H05K 7/205; H05K 5/03; H05K 5/04; H05K 7/1422; H05K 7/1427; H05K 7/1489; H05K 1/0201; H05K 1/0281; H05K 1/14; H05K 1/141; H05K 1/18; G06F 1/132
USPC .............. 361/679.31–679.39, 724–727, 752; 312/223.1–223.2
See application file for complete search history.

(56) References Cited

U.S. PATENT DOCUMENTS

| | | | | |
|---|---|---|---|---|
| 5,091,823 | A * | 2/1992 | Kanbara | H02M 5/44 174/351 |
| 8,665,601 | B1 * | 3/2014 | Mangay-Ayam, Jr. | G11C 5/04 361/728 |
| 9,119,327 | B2 | 8/2015 | Albrecht, III et al. | |
| 2005/0052858 | A1 * | 3/2005 | Shima | H04B 15/00 361/814 |
| 2013/0214406 | A1 * | 8/2013 | Schultz | H01L 23/46 257/713 |

FOREIGN PATENT DOCUMENTS

| JP | 2008-41955 | 2/2008 |
|---|---|---|
| JP | 2011-155049 | 8/2011 |

\* cited by examiner

*Primary Examiner* — Anthony Haughton
*Assistant Examiner* — Ingrid Wright
(74) *Attorney, Agent, or Firm* — Oblon, McClelland, Maier & Neustadt, L.L.P.

(57) ABSTRACT

According to one embodiment, a storage device includes an enclosure, and a circuit board assembly in the enclosure. The circuit board assembly includes a first circuit board on which a heat-producing component is mounted, a second circuit board, a third circuit board, a first connector connecting the first and second circuit boards, a second connector connecting the second and third circuit boards, a first spacer sandwiched between the first and second circuit boards, and a second spacer sandwiched between the second and third circuit boards. The first spacer includes a spacer frame, a partition member opposed to the heat-producing component with a gap between, and a thermal transfer member attached to the partition member and in contact with the first circuit board.

17 Claims, 8 Drawing Sheets

STORAGE DEVICE

CROSS-REFERENCE TO RELATED APPLICATIONS

This application claims the benefit of U.S. Provisional Application No. 62/271,890, filed Dec. 28, 2015, the entire contents of which are incorporated herein by reference.

FIELD

Embodiments described herein relate generally to a storage device.

BACKGROUND

Currently, magnetic disk devices, solid-state storage drives (SSDs) and the like are used as storage devices. An SSD comprises, for example, stacked circuit boards and an enclosure accommodating these circuit boards. Memory devices such as NAND flash memories are mounted on each circuit board. A heat-producing component such as a semiconductor device is mounted on at least one of the circuit boards. Adjacent circuit boards are connected to each other via a connector. When three or more circuit boards are stacked, the space between the circuit boards becomes narrow and the heat of the heat-producing component cannot be easily dissipated. As a result, components mounted on the circuit boards are heated and the temperature rises in some cases.

DETAILED DESCRIPTION

Various embodiments will be described hereinafter with reference to the accompanying drawings. In general, according to one embodiment, a storage device comprises an enclosure, and a circuit board assembly accommodated in the enclosure. The circuit board assembly comprises a first circuit board on which a memory device and a heat-producing component are mounted; a second circuit board opposed to the first circuit board, on which a memory device is mounted; a third circuit board opposed to the second circuit board, on which a memory device is mounted; a first connector provided between the first circuit board and the second circuit board and connecting the first circuit board to the second circuit board; a second connector provided between the second circuit board and the third circuit board and connecting the second circuit board to the third circuit board; a frame-shaped first spacer sandwiched between the first circuit board and the second circuit board; and a frame-shaped second spacer sandwiched between the second circuit board and the third circuit board. The first spacer comprises a spacer frame, a partition member extending from the spacer frame and opposed to the heat-producing component with a gap between, and a thermal transfer member attached to the partition member and in contact with the first circuit board.

As a storage device, a solid-state storage drive (SSD) of an embodiment is hereinafter described in detail.

First Embodiment

Figure 1:
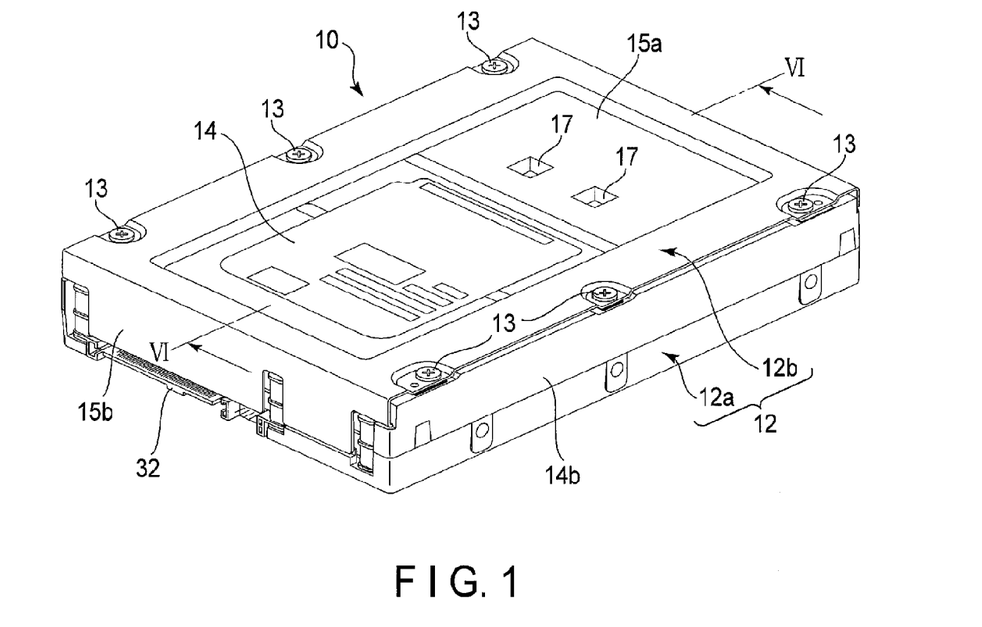
FIG. 1 is a perspective view showing an appearance of a storage device of a first embodiment.
Figure 2:
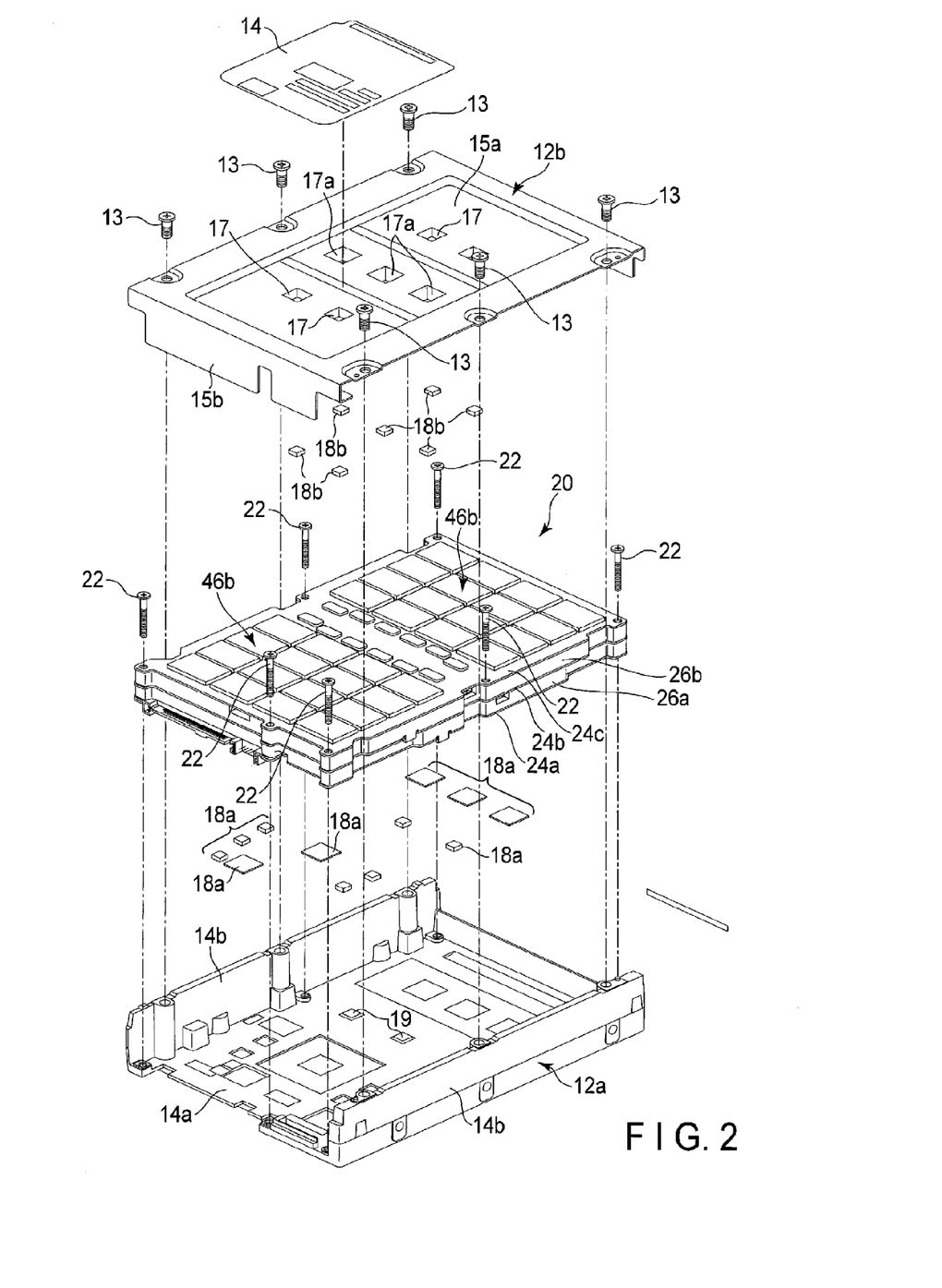
FIG. 2 is an exploded perspective view of the storage device.
Figure 3:
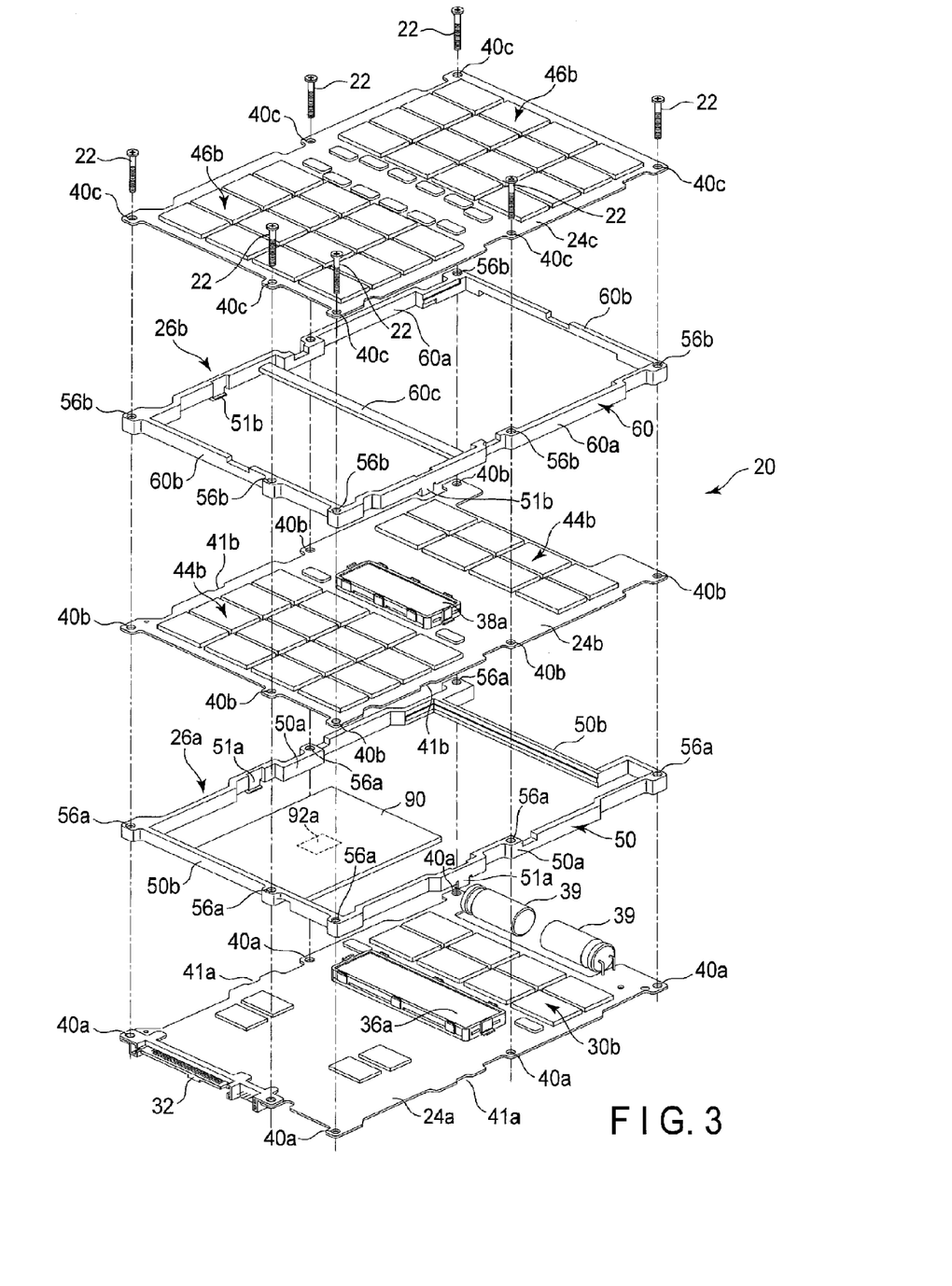
FIG. 3 is an exploded perspective view of a circuit board assembly of the storage device.
Figure 4:
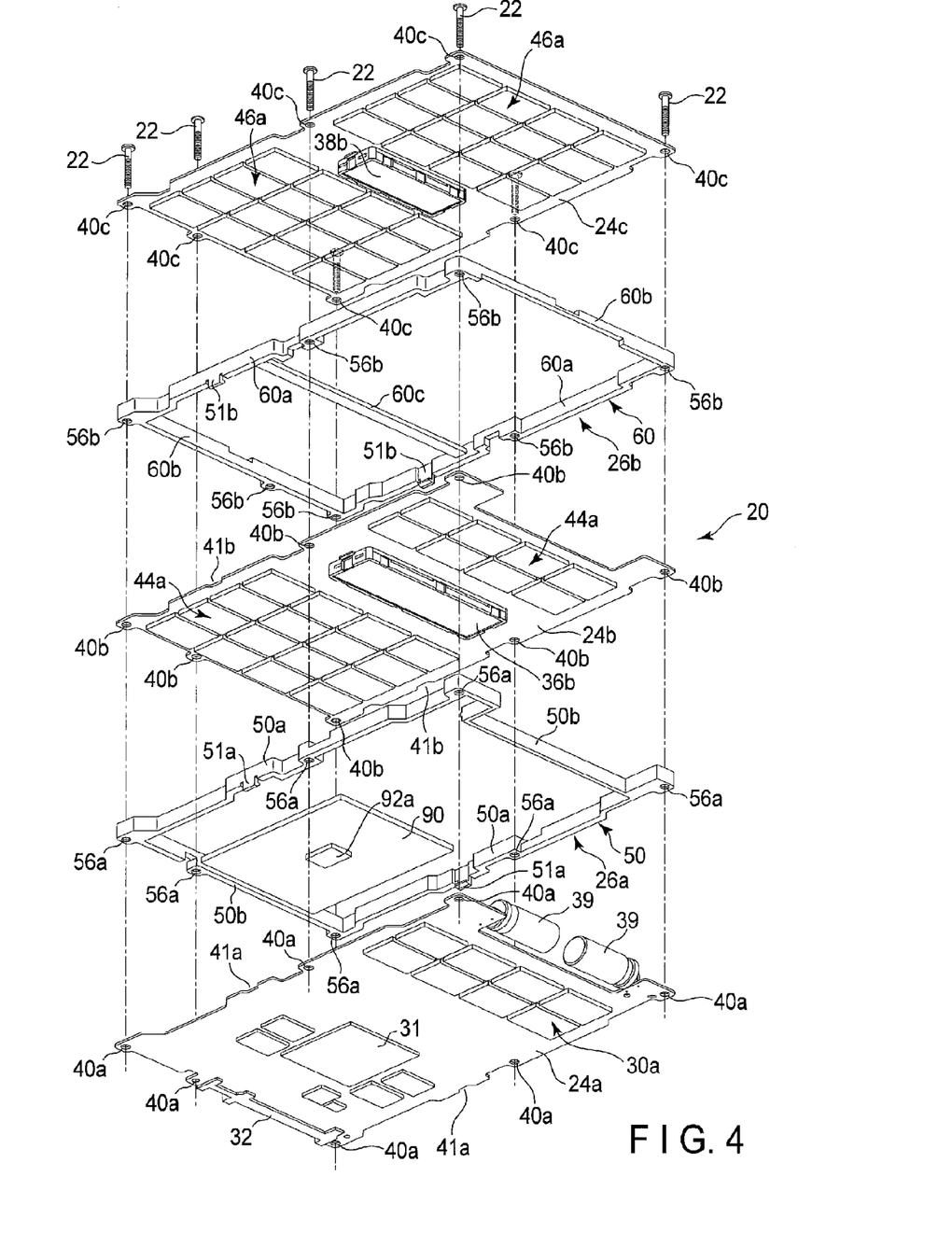
FIG. 4 is an exploded perspective view showing the circuit board assembly from the lower surface side.
Figure 5:
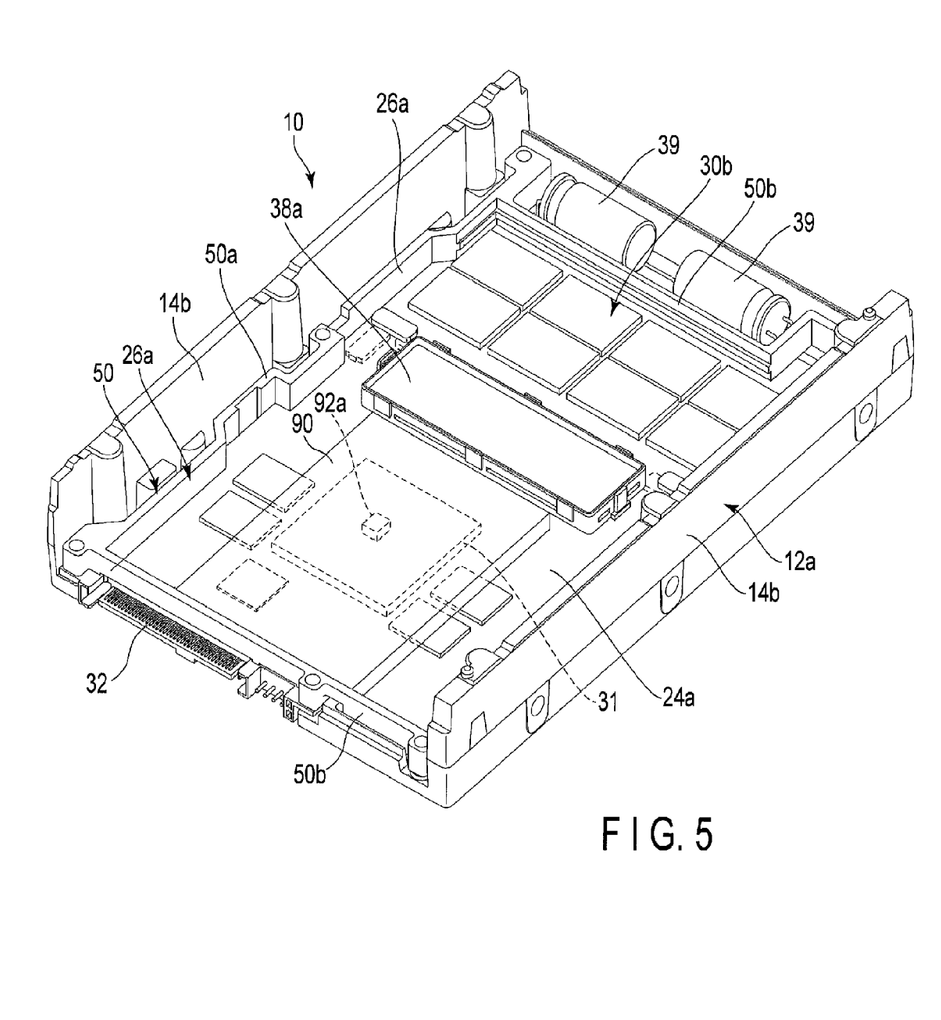
FIG. 5 is a perspective view partially showing an enclosure and the circuit board assembly of the storage device.
Figure 6:
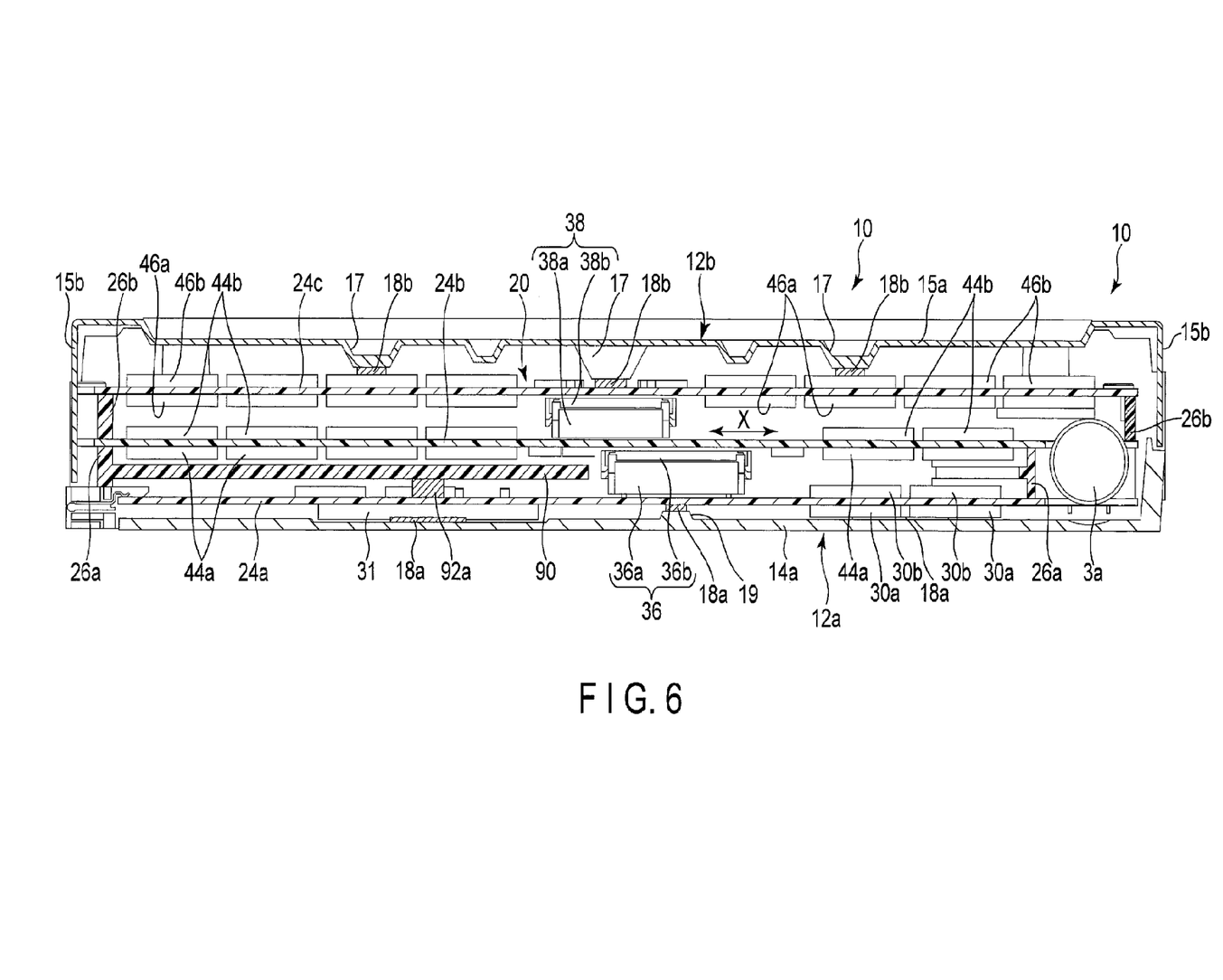
FIG. 6 is a cross-sectional view of the storage device seen along VI-VI of FIG. 1.

FIG. 1 is a perspective view showing an appearance of an SSD of a first embodiment. FIG. 2 is an exploded perspective view of the SSD. FIG. 3 is an exploded perspective view of a circuit board assembly of the SSD. FIG. 4 is an exploded perspective view showing the circuit board assembly from the lower surface side. FIG. 5 is a perspective view partially showing an enclosure and the circuit board assembly of the SSD. FIG. 6 is a cross-sectional view of the SSD seen along VI-VI of FIG. 1.

As shown in FIG. 1, FIG. 2, FIG. 5 and FIG. 6, an SSD 10 comprises an enclosure 12 having the shape of a rectangular box and a circuit board assembly 20 accommodated in the enclosure 12. The enclosure 12 comprises a rectangular base 12a formed of aluminum, etc., and a cover 12b fixed to the base 12a. The base 12a integrally comprises a rectangular bottom wall (first wall) 14a and a pair of long-side walls 14b provided along the long sides of the bottom wall 14a. Screw holes for fixing the cover 12b are formed on the top end of each long-side wall 14b. Screw holes for fixing the circuit board assembly 20 are formed at both side edges of the bottom wall 14a. Several (for example, two) projections (bosses) 19 are formed in the center of the bottom wall 14a. The bosses 19 are located in a position opposed to a first connector 36 of the circuit board assembly 20 to be described later. As a heat-sink member, heat-sink pads or heat-sink sheets 18a having thermal transfer and cushioning characteristics are attached to the bosses 19 and several points on the inner surface of the bottom wall 14a. When the circuit board assembly 20 is accommodated in the enclosure 12, the heat-sink sheets 18a are elastically in contact with the circuit board assembly 20.

The cover 12b integrally comprises a rectangular top plate (second wall) 15a and a pair of side plates 15b provided along the short sides of the top plate 15a. The cover 12b is put on the base 12a and fixed to the base 12a by suitable fastenings, for example, six screws 13. A label 14 is attached to the top plate 15a. Recesses (projections) 17 protruding toward the base 12a side are provided on the top plate 15a. On the inner surface side of the top plate 15a, a heat sink-pad or heat-sink sheet 18b having thermal transfer and cushioning characteristics is attached to the top of each recess 17 as a heat-sink member. When the circuit board assembly 20 is accommodated in the enclosure 12, the heat-sink sheets 18b are elastically in contact with the circuit board assembly 20. For example, three of the recesses 17 (recesses 17a) are located in a position opposed to a second connector 38 of the circuit board assembly 20 to be described later.

As shown in FIG. 2 to FIG. 4 and FIG. 6, the circuit board assembly 20 comprises several (for example, three) stacked circuit boards 24a, 24b and 24c, a first spacer 26a and a second spacer 26b sandwiched between the circuit boards and a first connector 36 and a second connector 38 electrically connecting the circuit boards, which are assembled into a stack structure. More specifically, the circuit board assembly 20 comprises a rectangular first circuit board 24a formed of a rigid printed circuit board, a rectangular second circuit board 24b located above and opposed to the first circuit board 24a and a rectangular third circuit board 24c located above and opposed to the second circuit board 24b. The first to third circuit boards 24a, 24b and 24c have approximately the same external dimensions.

NAND flash memories 30a serving as memory devices, a CPU 31 serving as a controller and other semiconductor devices are mounted on a lower surface (first principal surface) of the first circuit board 24a. The CPU 31 is a heat-producing component which produces heat by operation. An interface connector 32 is mounted on one end in the longitudinal direction of the first circuit board 24a. NAND flash memories 30b serving as memory devices and other semiconductor devices are mounted on an upper surface (second principal surface) of the first circuit board 24a. A first-board-side first connector (stacking connector or board-to-board connector) 36a constituting the first connector 36 is mounted substantially in the central portion of the upper surface of the first circuit board 24a. The first-board-side first connector 36a has an elongated rectangular shape and is located such that the longitudinal direction of the first-board-side first connector 36a corresponds to the width direction of the first circuit board 24a. Two capacitors 39 are mounted on the other end of the first circuit board 24a. Through-holes 40a for inserting screws 22 are formed on the peripheral edge of the first circuit board 24a. Notches 41a engageable with tabs of the first spacer 26a are formed on the long-side edges of the first circuit board 24a.

The second circuit board 24b is located with the lower surface (first principal surface) opposed to the upper surface of the first circuit board 24a. NAND flash memories 44a serving as memory devices are mounted on the lower surface of the second circuit board 24b. A second-board-side first connector (stacking connector or board-to-board connector) 36b constituting the first connector 36 is mounted substantially in the center of the lower surface of the second circuit board 24b. The second-board-side first connector 36b has an elongated rectangular shape and is located such that the longitudinal direction of the second-board-side first connector 36b corresponds to the width direction of the second circuit board 24b. In addition, the second-board-side first connector 36b is located in a position opposed to the first-board-side first connector 36a of the first circuit board 24a. Accordingly, when the second circuit board 24b is put on the first circuit board 24a, the second-board-side first connector 36b is engaged with the first-board-side first connector 36a to form the first connector 36.

NAND flash memories 44b serving as memory devices and other semiconductor devices are mounted on an upper surface (second principal surface) of the second circuit board 24b. A second-board-side second connector (stacking connector or board-to-board connector) 38a constituting the second connector 38 is mounted substantially in the center of the upper surface of the second circuit board 24b. The second-board-side second connector 38a has an elongated rectangular shape and is located such that the longitudinal direction of the second-board-side second connector 38a corresponds to the width direction of the second circuit board 24b. The second-board-side second connector 38a is deviated, i.e., offset relative to the second-board-side first connector 36b constituting the first connector 36 in a surface direction (X-direction) of the second circuit board 24b. The offset can be arbitrarily set, for example, such that about half the width of the second-board-side second connector 38a overlaps the second-board-side first connector 36b. Since the second-board-side first connector 36b and the second-board-side second connector 38a provided on the lower surface and the upper surface of the second circuit board 24b are offset relative to each other, flexibility in connection between the connectors 36b and 38a and interconnects on the second circuit board 24b can be improved and the interconnects can be easily routed and connected.

Through-holes 40b for inserting the screws 22 are formed on the peripheral edge of the second circuit board 24b. Notches 41b engageable with tabs of the second spacer 26b are formed on the long-side ends of the second circuit board 24b.

The third circuit board 24c is located with the lower surface (first principal surface) opposed to the upper surface of the second circuit board 24b. NAND flash memories 46a serving as memory devices are mounted on the lower surface of the third circuit board 24c. A third-board-side second connector (stacking connector or board-to-board connector) 38b constituting the second connector 38 is mounted substantially in the center of the lower surface of the third circuit board 24c. The third-board-side second connector 38b has an elongated rectangular shape and is located such that the longitudinal direction of the third-board-side second connector 38b corresponds to the width direction of the third circuit board 24c. In addition, the third-board-side second connector 38b is located in a position opposed to the second-board-side second connector 38a of the second circuit board 24b. Accordingly, when the third circuit board 24c is put on the second circuit board 24b, the third-board-side second connector 38b is engaged with the second-board-side second connector 38a to form the second connector 38. In the present embodiment, connectors having dimensions smaller than those of the first connector 36 are used for the second-board-side second connector 38a and the third-board-side second connector 38b constituting the second connector 38.

NAND flash memories 46b serving as memory devices and other semiconductor devices are mounted on the upper surface (second principal surface) of the third circuit board 24c. Through-holes 40c for inserting the screws 22 are formed on the peripheral edge of the third circuit board 24c.

As shown in FIG. 3 to FIG. 6, the first spacer 26a of the circuit board assembly 20 comprises a rectangular spacer frame 50 and a substantially-rectangular partition plate 90 coupled to the spacer frame 50, which are integrally formed of, for example, synthetic resin or metal. A thermal transfer pad 92a having thermal transfer and cushioning characteristics and serving as a thermal transfer member is attached to the lower surface of the partition plate 90.

The spacer frame 50 comprises a pair of long-side portions 50a opposed to each other and a pair of short-side portions 50b opposed to each other. The thickness (height) of the spacer frame 50 is approximately equal to the space between the first circuit board 24a and the second circuit board 24b (in the case where the first connectors 36 are connected). The spacer frame 50 has approximately the same external dimensions as the first circuit board 24a. Each long-side portion 50a of the spacer frame 50 comprises a tab 51a engageable with the notch 41a of the first circuit board 24a. Through-holes 56a for inserting the screws 22 are formed at several points on the spacer frame 50. Positioning pins (not shown) engageable with the first circuit board 24a are provided at several points on the lower surface of the spacer frame 50.

The partition plate 90 serving as a partition member is coupled to one of the short-side portions 50*b* of the spacer frame 50 and extends from this short-side portion 50*b* toward the other short-side portion 50*b* substantially up to the center of the spacer frame 50. The partition plate 90 has a thickness less than the thickness (height) of the spacer frame 50 and a width less than the length of the short-side portion 50*b*. The partition plate 90 is located between the first circuit board 24*a* and the second circuit board 24*b* substantially parallel to these circuit boards. The partition plate 90 is opposed to the upper surface of the first circuit board 24*a* with a gap or a space between and opposed to the lower surface of the second circuit board 24*b* with a gap or a space between. In addition, the partition plate 90 is opposed to all or part of an area of the first circuit board 24*a* in which the CPU (heat-producing component) 31 is mounted.

The thermal transfer pad 92*a* is attached to the lower surface (surface opposed to the first circuit board 24*a*) of the partition plate 90 so as to be opposed to the CPU 31. When the first spacer 26*a* is put on the first circuit board 24*a*, the thermal transfer pad 92*a* is in contact with the upper surface (second principal surface) of the first circuit board 24*a* in a position opposed to the CPU 31.

The above-described partition plate 90 of the first spacer 26*a* shields the second circuit board 24*b* and the other components against radiation of heat from the CPU 31 through the first circuit board 24*a*. The heat of the first circuit board 24*a* is transferred to the partition plate 90 through the thermal transfer pad 92*a*, transferred from the partition plate 90 to the spacer frame 50, further transferred to the enclosure 12 through the screws 22 to be described later and dissipated from the enclosure 12 to the outside.

The second spacer 26*b* of the circuit board assembly 20 comprises a spacer frame 60 obtained by forming synthetic resin into a rectangular frame. The spacer frame 60 comprises a pair of long-side portions 60*a* opposed to each other and a pair of short-side portions 60*b* opposed to each other. The thickness (height) of the spacer frame 60 is approximately equal to the space between the second circuit board 24*b* and the third circuit board 24*c* (in the case where the second connectors 38 are connected). The spacer frame 60 has approximately the same external dimensions as the second circuit board 24*b*. Each long-side portion 60*a* of the spacer frame 60 comprises a tab 51*b* engageable with the notch 41*b* of the circuit board 24*b*. Through-holes 56*b* for inserting the screws 22 are formed at several points on the spacer frame 60. Positioning pins (not shown) engageable with the second circuit board 24*b* are provided at several points on the lower surface of the spacer frame 60.

The second spacer 26*b* may comprise a coupling bead (not shown) for coupling the long-side portions 60*a* of the spacer frame 60.

The above-described constituent members of the circuit board assembly 20 are sequentially stacked and electrically connected to each other through the first connector 36 and the second connector 38. More specifically, as shown in FIG. 2 to FIG. 6, the first spacer 26*a* is put on the peripheral edge of the first circuit board 24*a* and the tabs 51*a* of the spacer frame 50 are engaged with the notches 41*a* and the lower surface of the first circuit board 24*a*. The spacer frame 50 is thereby attached to the first circuit board 24*a* in a state of being positioned on the peripheral edge of the first circuit board 24*a*. The second circuit board 24*b* is put on the first spacer 26*a* and the second-board-side first connector 36*b* is engaged with the first-board-side first connector 36*a*. In this manner, the first circuit board 24*a* and the second circuit board 24*b* are electrically and mechanically connected to each other by the first connector 36. The spacer frame 50 of the first spacer 26*a* is sandwiched between the peripheral edge of the first circuit board 24*a* and the peripheral edge of the second circuit board 24*b* and keeps the space between the first and second circuit boards. The partition plate 90 of the first spacer 26*a* is located between the first circuit board 24*a* and the second circuit board 24*b* and opposed to the mounting position of the CPU 31. The thermal transfer pad 92*a* of the first spacer 26*a* is in contact with the upper surface of the first circuit board 24*a* in the position opposed to the CPU 31.

The second spacer 26*b* is put on the peripheral edge of the second circuit board 24*b* and the tabs 51*b* of the spacer frame 60 are engaged with the notches 41*b* and the lower surface of the second circuit board 24*b*. The spacer frame 60 is thereby attached to the second circuit board 24*b* in a state of being positioned on the peripheral edge of the second circuit board 24*b*. The third circuit board 24*c* is put on the second spacer 26*b* and the third-board-side second connector 38*b* is engaged with the second-board-side second connector 38*a*.

Since the third circuit board 24*c* is put on the second spacer 26*b* and the third-board-side second connector 38*b* is engaged with the second-board-side second connector 38*a*, the spacer frame 60 of the second spacer 26*b* is sandwiched between the peripheral edge of the second circuit board 24*b* and the peripheral edge of the third circuit board 24*c* and keeps the space between the second and third circuit boards.

As shown in FIG. 2, the circuit board assembly 20 assembled as described above is fixed to the bottom wall 14*a* of the base 12*a* by the screws 22 inserted into the through-holes 40*c*, 56*b*, 40*b*, 56*a* and 40*a* of the third circuit board 24*c*, the second spacer 26*b*, the second circuit board 24*b*, the first spacer 26*a* and the first circuit board 24*a* from the third circuit board 24*c* side, and the constituent members of the circuit board assembly 20 are thereby clamped to each other.

As shown in FIG. 1 and FIG. 6, the lower surface of the first circuit board 24*a* of the circuit board assembly 20 fixed to the base 12*a* is opposed to the bottom wall 14*a* of the base 12*a* with narrow space between. The CPU 31 and the NAND flash memories 30*a* mounted on the first circuit board 24*a* are in contact with the base 12*a* through the heat-sink sheets 18*a*. Of the first circuit board 24*a*, the back surface of a portion equipped with the first connector 36 is in contact with the bottom wall 14*a* of the base 12*a* through the heat-sink sheets 18*a*.

The third circuit board 24*c* of the circuit board assembly 20 is opposed to the top plate 15*a* of the cover 12*b* with narrow space between. The NAND flash memories 46*b* mounted on the third circuit board 24*c* are in contact with the recesses 17 of the top plate 15*a* through the heat-sink sheets 18*b*. Of the third circuit board 24*c*, the back surface of a portion equipped with the second connector 38 is in contact with the recesses 17*a* of the top plate 15*a* through the heat-sink sheets 18*b*.

The interface connector 32 mounted on the first circuit board 24*a* is exposed to the outside through an opening of the enclosure 12.

According to the first embodiment, a high-capacity SSD can be realized by using a circuit board assembly in which three circuit boards are stacked. In addition, since the partition plate 90 is provided on the first spacer 26*a* to face a heat-producing component and a thermal transfer member is provided on the partition plate to touch the first circuit board 24*a*, the partition plate can shield against radiation of heat of the heat-producing component and the heat of the heat-producing component can be transferred to the first circuit board, the thermal transfer member, the partition plate and the spacer frame and dissipated. The first to third circuit boards, the components mounted thereon and the heat-producing component can be thereby prevented from temperature increase and the reliability of the SSD can be improved. The temperature increase can be prevented at low cost by integrating the partition plate and the thermal transfer member with the spacer.

Since a portion of the circuit board assembly 20 equipped with the first and second connectors 36 and 38 is supported by the recesses (projections) 17a, the heat-sink sheets 18b, the bosses 19 and the heat-sink sheets 18a from both the base 12a side and the cover 12b side of the enclosure 12, the first and second connectors 36 and 38 can be strongly kept engaged with each other and the shock resistance of the SSD can be improved.

Next, an SSD of another embodiment is described. In the embodiment described below, elements equivalent to those of the first embodiment are represented by the same reference numbers and their detailed description is omitted. Differences from the first embodiment are mainly described in detail.

Second Embodiment

Figure 7:
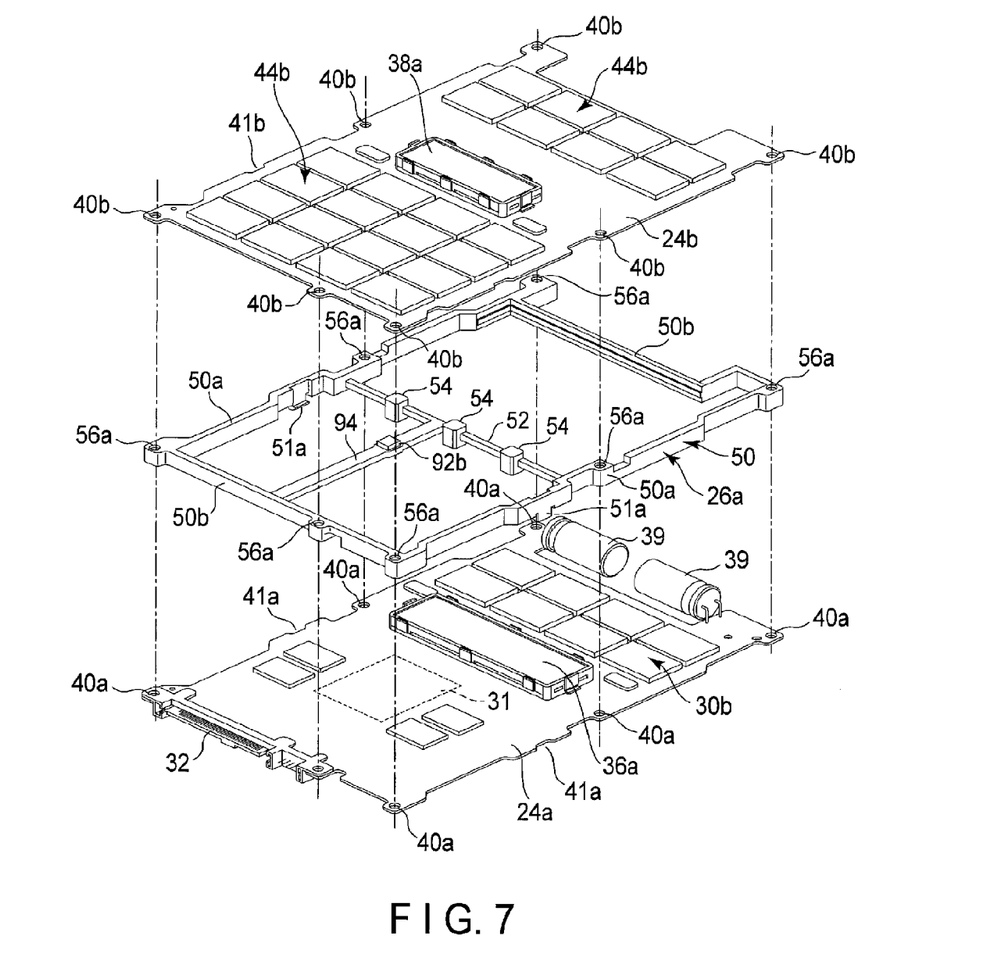
FIG. 7 is an exploded perspective view partially showing a circuit board assembly of a storage device of a second embodiment.
Figure 8:
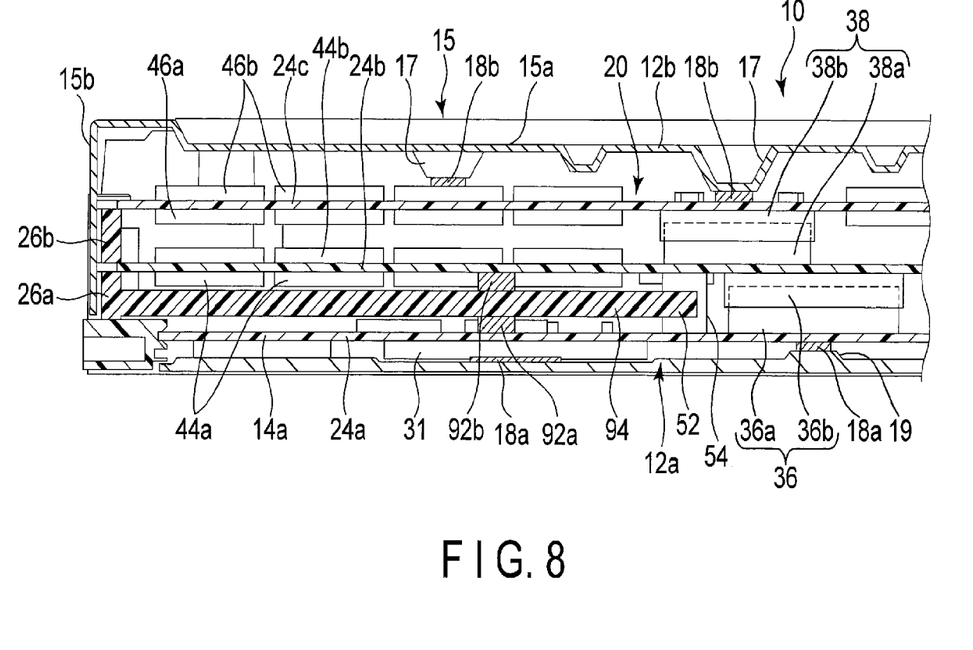
FIG. 8 is a cross-sectional view of the storage device of the second embodiment.

FIG. 7 is an exploded perspective view partially showing a circuit board assembly of an SSD of the second embodiment. FIG. 8 is a cross-sectional view of the SSD of the second embodiment.

As shown in FIG. 7 and FIG. 8, according to the second embodiment, a first spacer 26a of a circuit board assembly 20 comprises a rectangular spacer frame 50, an elongated partition beam 94 serving as a partition member, a support beam 52 coupled to the spacer frame 50 and several (for example, three) support posts 54 provided in the support beam 52, which are integrally formed of synthetic resin or metal. The support beam 52 is provided between a pair of long-side portions 50a of the spacer frame 50 and is coupled to these long-side portions 50a. The thickness of the support beam 52 is less than that of the spacer frame 50.

The three support posts 54 are provided orthogonal to the support beam 52 and spaced out in the longitudinal direction of the support beam 52. The three support posts 54 are located in a position opposed to the second connector 38 with a second circuit board 24b between. Each support post 54 has approximately the same height as the thickness of the spacer frame 50. The upper and lower ends of each support post 54 can be in contact with the first circuit board 24a and the second circuit board 24b, respectively. The three support posts 54 constitute a support body which supports the second connector 38. The support posts 54 are coupled to the spacer frame 50 through the support beam 52 and supported by the support beam 52.

The partition beam 94 is provided between the support beam 52 and the short-side portion 50b of the spacer frame 50 and extends in the longitudinal direction of the spacer frame 50. The ends of the partition beam 94 are coupled to the short-side portion 50b and the support beam 52, respectively. The thickness of the partition beam 94 is less than that of the spacer frame 50. Accordingly, the partition beam 94 is opposed to each of the first circuit board 24a and the second circuit board 24b with narrow space between. At least part of the partition beam 94 is opposed to an area of the first circuit board 24a equipped with a CPU 31 (heat-producing component).

The first spacer 26a further comprises a first thermal transfer pad 92a attached to a lower surface (surface opposed to the first circuit board 24a) of the partition beam 94 and a second thermal transfer pad 92b attached to an upper surface (surface opposed to the second circuit board 24b) of the partition beam 94. The first thermal transfer pad 92a is in contact with the upper surface of the first circuit board 24a in a position opposed to the CPU 31. The second thermal transfer pad 92b is located on the opposite side of the first thermal transfer pad 92a and in contact with the lower surface of the second circuit board 24b.

The other elements of the circuit board assembly 20 and the SSD of the second embodiment are the same as those of the SSD of the first embodiment.

According to the second embodiment, since a partition beam 94 is provided in a spacer to face a heat-producing component and a thermal transfer member is provided on the partition beam 94 to touch the first circuit board 24a, the partition beam 94 can partially shield against radiation of heat of the heat-producing component and the heat of the heat-producing component can be transferred to the first circuit board 24a, the thermal transfer member, the partition beam and the spacer frame and dissipated. The first and second circuit boards, the components mounted thereon and the heat-producing component can be thereby prevented from temperature increase and the reliability of the SSD can be improved. Since the spacer comprising a support body for supporting connectors is provided between the circuit boards, the connectors can be prevented from being imperfectly engaged and the ease of assembly and the reliability can be improved. The temperature increase can be prevented and the connectors can be supported at low cost by integrating the supporting member and the thermal transfer member with the spacer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the shape of the partition member of the spacer is not limited to a plate or a beam and various shapes can be adopted. The support body of the spacer is not limited to support posts and may have various shapes. The number of the circuit boards of the circuit board assembly is not limited to three and four or more circuit boards may be stacked.

What is claimed is:

1. A storage device comprising:
an enclosure; and
a circuit board assembly accommodated in the enclosure, the circuit board assembly comprising:
a first circuit board on which a memory device and a heat-producing component are mounted;
a second circuit board opposed to the first circuit board, on which a memory device is mounted;
a first connector provided between the first circuit board and the second circuit board and connecting the first circuit board to the second circuit board; and
a frame-shaped first spacer sandwiched between the first circuit board and the second circuit board;

wherein
the first spacer comprises:
a spacer frame;
a partition member extending from the spacer frame and opposed to the heat-producing component with a gap between;
a thermal transfer member attached to the partition member and in contact with the first circuit board;
a support beam coupled to the spacer frame; and
a support body provided in the support beam, the partition member comprising a partition beam coupled to the spacer frame and the support beam.

2. The storage device of claim 1, wherein
the first circuit board comprises a first principal surface opposed to an inner surface of the enclosure, and a second principal surface opposed to the second circuit board, the heat-producing component is mounted on the first principal surface, and the thermal transfer member of the first spacer is in contact with the second principal surface of the first circuit board in a position opposed to the heat-producing component.

3. The storage device of claim 1, wherein
the first spacer comprises a first thermal transfer member attached to the partition beam and in contact with the first circuit board; and a second thermal transfer member attached to the partition beam and in contact with the second circuit board.

4. The storage device of claim 1, wherein
the circuit board assembly is fixed to the enclosure by fixation screws penetrating the second circuit board, the first spacer and the first circuit board.

5. The storage device of claim 1, further comprising a heat sink member provided on the enclosure and in contact with the heat-producing component.

6. The storage device of claim 1, wherein
the enclosure comprises a first wall opposed to the first circuit board of the circuit board assembly, and
the first wall comprises a projection in contact with the first circuit board in a position opposed to the first connector of the circuit board assembly.

7. The storage device of claim 6, wherein
the enclosure comprises a heat-sink sheet provided between the projection of the first wall and the first circuit board.

8. The storage device of claim 1, wherein
the first spacer is formed of synthetic resin or metal.

9. The storage device of claim 1, wherein
the circuit board assembly further includes:
a third circuit board opposed to the second circuit board, on which a memory device is mounted;
a second connector provided between the second circuit board and the third circuit board and connecting the second circuit board to the third circuit board; and
a frame-shaped second spacer sandwiched between the second circuit board and the third circuit board, wherein
the support body is provided at a position opposed to the second connector.

10. A storage device comprising:
an enclosure; and
a circuit board assembly accommodated in the enclosure, the circuit board assembly comprising:
a first circuit board on which a memory device and a heat-producing component are mounted;
a second circuit board opposed to the first circuit board, on which a memory device is mounted;
a first connector provided between the first circuit board and the second circuit board and connecting the first circuit board to the second circuit board; and
a first spacer sandwiched between the first circuit board and the second circuit board; wherein
the first spacer comprises:
a spacer frame;
a partition plate coupled to the spacer frame, extending from the spacer frame, and opposed to the first circuit board and the heat-producing component with a gap between; and
a thermal transfer member attached to the partition plate and in contact with the first circuit board.

11. The storage device of claim 10, wherein
the first circuit board comprises a first principal surface opposed to an inner surface of the enclosure, and a second principal surface opposed to the second circuit board, the heat-producing component is mounted on the first principal surface, and the thermal transfer member of the first spacer is in contact with the second principal surface of the first circuit board in a position opposed to the heat-producing component.

12. The storage device of claim 10, wherein
the spacer frame comprises a pair of long-side portions opposed to each other; and
a pair of short-side portions opposed to each other, and the partition plate extends from one of the short-side portions toward an other of the short-side portions.

13. The storage device of claim 10, wherein
the circuit board assembly is fixed to the enclosure by fixation screws penetrating the second circuit board, the first spacer and the first circuit board.

14. The storage device of claim 10, further comprising a heat sink member provided on the enclosure and in contact with the heat-producing component.

15. The storage device of claim 10, wherein
the enclosure comprises a first wall opposed to the first circuit board of the circuit board assembly, and
the first wall comprises a projection in contact with the first circuit board in a position opposed to the first connector of the circuit board assembly.

16. The storage device of claim 15, wherein
the enclosure comprises a heat-sink sheet provided between the projection of the first wall and the first circuit board.

17. The storage device of claim 10, wherein
the first spacer is formed of synthetic resin or metal.

* * * * *

UNITED STATES PATENT AND TRADEMARK OFFICE
CERTIFICATE OF CORRECTION

PATENT NO. : 9,807,899 B2
APPLICATION NO. : 15/049232
DATED : October 31, 2017
INVENTOR(S) : Yoshiharu Matsuda et al.

Page 1 of 1

It is certified that error appears in the above-identified patent and that said Letters Patent is hereby corrected as shown below:

On the Title Page

Item (73), the Assignee's information is incorrect. Item (73) should read:
--(73) Assignee: TOSHIBA MEMORY CORPORATION, Minato-ku (JP)--

Signed and Sealed this
Twentieth Day of November, 2018

Andrei Iancu
*Director of the United States Patent and Trademark Office*